US008962492B2

(12) United States Patent
Reynaud et al.

(10) Patent No.: US 8,962,492 B2
(45) Date of Patent: Feb. 24, 2015

(54) METHOD TO THIN A SILICON-ON-INSULATOR SUBSTRATE

(75) Inventors: Patrick Reynaud, Saint Martin d'Hères (FR); Ludovic Ecarnot, Vif (FR); Khalid Radouane, Montbonnot Saint Martin (FR)

(73) Assignee: Soitec, Bernin (FR)

( * ) Notice: Subject to any disclaimer, the term of this patent is extended or adjusted under 35 U.S.C. 154(b) by 518 days.

(21) Appl. No.: 13/257,901

(22) PCT Filed: Apr. 20, 2010

(86) PCT No.: PCT/EP2010/055198
§ 371 (c)(1),
(2), (4) Date: Sep. 20, 2011

(87) PCT Pub. No.: WO2010/122023
PCT Pub. Date: Oct. 28, 2010

(65) Prior Publication Data
US 2012/0009797 A1    Jan. 12, 2012

(30) Foreign Application Priority Data
Apr. 21, 2009    (FR) ...................... 09 52581

(51) Int. Cl.
*H01L 21/302*    (2006.01)
*H01L 21/461*    (2006.01)
(Continued)

(52) U.S. Cl.
CPC .... *H01L 21/30604* (2013.01); *H01L 21/76254* (2013.01)
USPC ............... 438/749; 216/95; 216/99; 438/745; 438/753

(58) Field of Classification Search
CPC .................. H01L 21/02052; H01L 21/02019; H01L 21/30604
USPC ................. 216/83, 95, 99; 438/745, 749, 753
See application file for complete search history.

(56) References Cited

U.S. PATENT DOCUMENTS 7,190,029 B2    3/2007 Neyret et al.
2004/0166650 A1 *   8/2004 Yokokawa et al. ........... 438/455
(Continued)

FOREIGN PATENT DOCUMENTS

CN    1619779 A    5/2005
CN    101088154 A    12/2007
(Continued)

OTHER PUBLICATIONS

G. K. Celler et al., XP-002602831, "Etching of Silicon by the RCA Standard Clean 1", Electrochemical and Solid State Letters, vol. 3, No. 1, pp. 47-49 (2000).
(Continued)

*Primary Examiner* — Allan Olsen
*Assistant Examiner* — Margaret D Klunk
(74) *Attorney, Agent, or Firm* — TraskBritt

(57) ABSTRACT

A method to thin an initial silicon-on-insulator substrate that has a layer of silicon oxide buried between a silicon carrier substrate and a silicon surface layer. This method is noteworthy in that it includes conducting a thermal oxidation treatment of the initial substrate to cause oxidation of part of the silicon surface layer and form a thermal oxide thereon; conducting a first cycle of etching followed by cleaning of the silicon surface layer after the thermal oxidation treatment, wherein the etching of the first cycle is conducted so as to fully remove the thermal oxide from the silicon surface layer to thin it and lift off all unstable parts of the initial substrate at edges thereof to form a thinned substrate; conducting, after the first cycle, a second cycle of etching followed by cleaning of the silicon surface layer, wherein the etching of the second cycle is conducted to remove from the surface of the thinned substrate, polluting particles formed during the first etching cycle and that have deposited thereupon, in order to obtain a final SOI substrate having a thinned surface layer that forms an active layer for the substrate.

14 Claims, 2 Drawing Sheets

(51) Int. Cl.
*C03C 15/00* (2006.01)
*C03C 25/68* (2006.01)
*H01L 21/306* (2006.01)
*H01L 21/762* (2006.01)

(56) References Cited

U.S. PATENT DOCUMENTS

2004/0259328 A1* 12/2004 Ito et al. .................. 438/459
2005/0230754 A1* 10/2005 Neyret et al. ............. 257/347
2006/0035445 A1* 2/2006 Neyret et al. ............. 438/472
2006/0234507 A1* 10/2006 Coletti et al. ............. 438/690
2007/0190746 A1 8/2007 Ito et al. .................. 438/455

FOREIGN PATENT DOCUMENTS

| EP | 1 480 265 A2 | 11/2004 |
| JP | 2005-005674 A | 1/2005 |
| JP | 2006-519504 A | 8/2006 |

OTHER PUBLICATIONS

International Search Report, PCT/EP2010/055198, mailed Oct. 28, 2010.
Colinge, Jean-Pierre, "Silicon on Insulator Technology: Materials to VLSI" Kluwer Academic Publisher, $2^{nd}$ Ed., pp. 50-51, 1997.

* cited by examiner

METHOD TO THIN A SILICON-ON-INSULATOR SUBSTRATE

CROSS-REFERENCE TO RELATED APPLICATION

This application is a 371 filing of International Patent Application PCT/EP2010/055198 filed Apr. 20, 2010.

BACKGROUND

The invention lies in the area of the fabrication of silicon-on-insulator substrates known to persons skilled in the art under the acronym "SOI."

A SOI substrate comprises a silicon oxide $SiO_2$ layer, buried between a silicon carrier substrate and a silicon surface layer called the "active layer" since it is on or in this layer that components will subsequently be fabricated intended for applications in the areas of electronics, optics, optoelectronics or microelectronics.

The present invention more specifically concerns a method to thin an initial substrate of SOI type, making it possible to obtain a SOI substrate having a silicon surface layer that is thin, even extra-thin, and whose surface is free or almost free of polluting particles.

The integration of transistors in microelectronics is made with increasingly smaller dimensions, since it is desired to increase the number of transistors packed on a wafer (or substrate). Breaking the "technological barrier of 22 nanometers," i.e., fabricating transistors having a width of 22 nanometers or less, may lead to requiring the use of SOI substrates known to those skilled in the art as "fully depleted" substrates.

In the substrates, the silicon surface layer forms a so-called "depletion" layer in which the concentration of mobile charges is much lower than the equilibrium concentration.

The fabrication of a "fully depleted" transistor requires a reduction in the thickness of the active silicon surface layer, which on this account must be equal to or less than 50 nanometers, preferably in the order of 10 nanometers to 30 nanometers.

It is also to be noted that the thickness of the buried oxide layer can also be reduced, i.e., to less than 15 nanometers, if it is desired to use this type of SOI substrate for the fabrication of components intended for applications of "low power" or "memory" type.

The thinner the desired active silicon surface layer, the more it is required to remove a substantial quantity of material from the initial SOI substrate.

When it is desired to thin the active silicon surface layer of the substrate, notably by etching, it is ascertained that the edges of the wafers are fragile, that they may break and form particles that are re-deposited on the active layer, thereby polluting this layer.

Also, with state of the art methods to fabricate SOI substrates, it is known to conduct treatment called Rapid Thermal Annealing (RTA). It is known that the effect of this treatment is to reduce the roughness of the silicon surface layer to achieve smoothing thereof.

It is also known from document FR-2 852 143 by the applicant, that RTA treatment can have the effect of overlapping and encapsulating the peripheral edge of the buried oxide layer of the SOI substrate, and that this encapsulation can prevent chemical attack and delamination of the edge of the buried oxide layer during a subsequent treatment step of the substrate.

The RTA treatment is therefore routinely conducted during the finishing steps of a SOI substrate.

However, the applicant has found that when the active silicon layer is considerably thinned, the so-called "encapsulation" layer, i.e., the layer facing the peripheral edge of the buried oxide, becomes damaged and no longer fulfils its protective role.

Appended FIG. 1, showing the state of the art, illustrates an encapsulation layer CE partly encapsulating the edge of a substrate SOI whose active silicon layer CA has a thickness of at least 100 nanometers. This encapsulation layer is consolidated by the onset of silicon bridges PT generated during RTA treatment.

The perspective diagram in FIG. 1A also shows the bridges PT and an oxide layer OX which can be seen at certain points between the bridges PT.

On the other hand, and as can be seen in appended FIG. 2, which illustrates a test result obtained by the applicant, if it is sought to further thin the active silicon layer CA of a substrate SOI, using a thermal oxidation process followed by an etching step, it is found that the bridges PT are either broken or have disappeared.

In this case, after the treatment, since the encapsulation layer is strongly damaged or has disappeared, the chemical product used for etching infiltrates the interface between the buried oxide layer and the surface silicon. The edge of the substrate lifts up and particles of silicon, and silicon together with oxide remnants, may break up and re-deposit on the active surface layer of the SOI substrate. Therefore substantial pollution of the substrate is observed, making it unfit for subsequent use in component fabrication. Additionally, the polluting particles may scratch the surface of the SOI substrate.

The person skilled in the art is therefore dissuaded from using etching to thin a SOI substrate, whether or not the substrate had undergone RTA treatment.

The objective of the invention is to solve the above-cited drawbacks of the prior art.

SUMMARY OF THE INVENTION

One particular objective of the invention is to provide a method allowing thinning of the active surface layer of an initial substrate of SOI type, whilst eliminating the particles generated by this thinning, whether or not this SOI substrate has been previously subjected to encapsulation treatment and/or to rapid thermal annealing of RTA type.

One particular objective of the invention is to provide the method with which it is possible to obtain a SOI substrate whose active silicon surface layer has a thickness of less than 50 nanometers and is of suitable quality for the subsequent fabrication of components.

For this purpose, the invention concerns a method to thin a silicon-on-insulator substrate SOI called the "initial substrate" comprising a silicon oxide layer $SiO_2$ buried between a silicon carrier substrate and a silicon surface layer.

According to the invention, this method comprises the following successive steps, consisting of conducting:
  thermal oxidation treatment of the initial substrate to cause oxidation of part of the silicon surface layer;
  a first cycle of etching then cleaning; and
  a second cycle of etching then cleaning,
  the etching of the first cycle being performed so as fully to remove the thermal oxide layer formed, to thin the silicon surface layer and to lift off all the unstable parts from the edge of the initial substrate, the etching of the second cycle being performed to remove from the surface of the thinned substrate, the polluting particles formed during the first etching cycle and that have deposited thereupon, so as to obtain a so-called "final" silicon-on insulator-substrate SOI whose thinned surface layer forms an active layer.

According to other advantageous but non-limiting characteristics of the invention, taken alone or in combination:

the initial SOI substrate, before the thermal oxidation treatment, has undergone overlapping and encapsulation treatment of the peripheral edge of the buried silicon oxide layer $SiO_2$, with a so-called "encapsulation" layer derived from the surface layer, and the oxidation treatment of the initial substrate is conducted so as to cause oxidation of the lateral encapsulation layer over its entire depth as far as the buried silicon oxide $SiO_2$ layer;

the overlapping and encapsulation treatment is conducted using rapid thermal annealing, RTA;

the thermal oxidation treatment is conducted at a temperature of between 800° C. and 1150° C.;

the different oxidation and etching steps are conducted so as to obtain a final silicon-on-insulator substrate whose so-called "extra-thin" active silicon layer has a thickness of 50 nm or less.

the different oxidation and etching steps are conducted so as to obtain a final silicon-on-insulator substrate whose so-called "extra-thin" active silicon layer has a thickness of 30 nm or less;

the initial silicon-on-insulator substrate SOI comprises a silicon surface layer whose thickness is 400 nm or less;

the etching of the first and/or second cycle is performed using a pure hydrofluoric acid HF solution diluted in water to a concentration of between 10% by volume and 50% by volume, at a temperature of between 20° C. and 30° C. for a time of between 30 seconds and 500 seconds;

the etching of the first cycle is performed using a pure hydrofluoric acid solution HF diluted in water to a concentration of 10% by volume, and is applied at a temperature of between 20° C. and 30° C. for a time of between 100 s and 500 s, to remove 100 nm of silicon oxide; and the cleaning of the first and/or second cycle is performed by immersing in water, then in a first bath of solution containing a mixture of ammonium hydroxide ($NH_4OH$), hydrogen peroxide $H_2O_2$) and deionized water, then in a second bath of solution containing a mixture of hydrochloric acid (HCl), hydrogen peroxide ($H_2O_2$) and deionized water.

BRIEF DESCRIPTION OF THE DRAWINGS

Other characteristics and advantages of the invention will become apparent from the following description given with reference to the appended drawings in which, in addition to FIGS. 1 and 2 already described and depicting photos of observations under scanning electron microscopy of one edge of a SOI substrate, and FIG. 1A, which is a schematic illustration of the SOI substrate in FIG. 1.

DETAILED DESCRIPTION OF THE INVENTION

The method according to the invention will now be described.

Figure 5C:
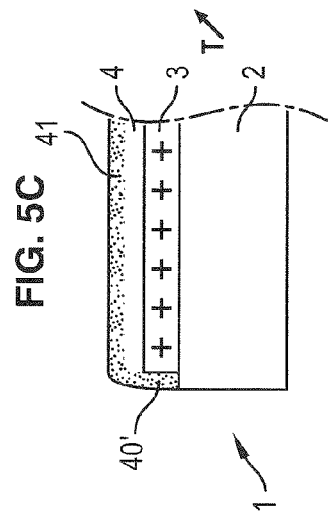
FIGS. 5A to 5F are schematics illustrating the different steps of the method conforming to the invention.
Figure 5F:
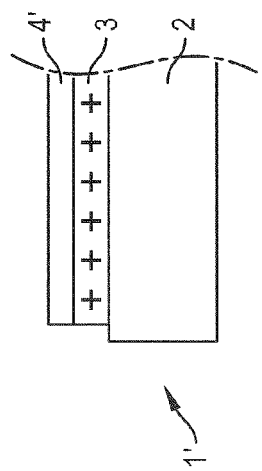
Figure 5B:
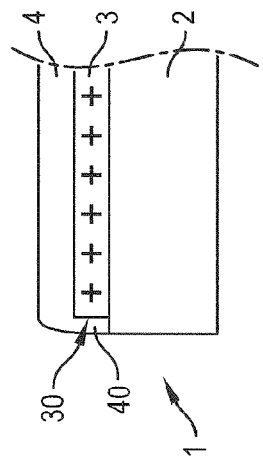
Figure 5E:
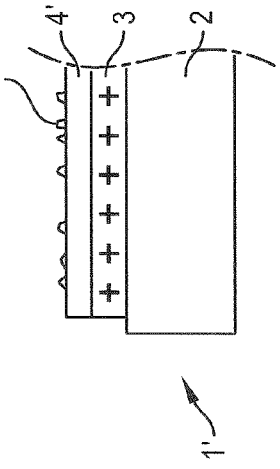
Figure 5A:
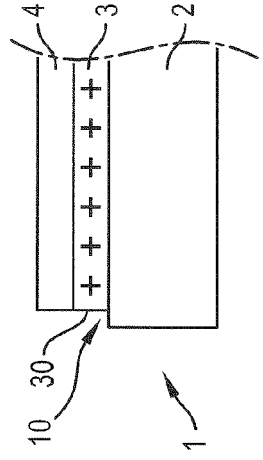

FIG. 5A illustrates a SOI substrate 1 comprising a carrier substrate 2 in silicon, coated with a layer 3 of silicon oxide $SiO_2$ and a surface layer 4 in silicon.

The oxide layer 3 is therefore buried between the two layers 2 and 4. Preferably, the thickness of the silicon surface layer is 400 nm or less.

This SOI substrate may have been obtained, for example, using a layer transfer process using the following chief steps:

creating a weakened region in the thickness of a donor substrate;

forming an oxide layer on the donor substrate (preferably before creating the weakened region), or on a receiver substrate;

bonding the donor substrate and receiver substrate; and detaching along the weakened region. An example of the transfer process is the SMARTCUT® process of which a description can be found in the work: "*Silicon On Insulator Technology:Materials to VLSI, $2^{nd}$ Edition*" by Jean-Pierre Colinge, published by "Kluwer Academic Publisher," pages 50 and 51.

It will be noted that during the detachment step, it is possible that layer transfer is accompanied by the creation of a substantially annular peripheral shoulder around the substrate that has been formed. This shoulder shall be called a "ring" and carries reference 10.

According to a first embodiment of the invention, the SOI substrate 1 is subjected to rapid thermal annealing RTA, conducted at a temperature of between 1000° C. and 1230° C., for a short time, generally less than ten minutes, in a hydrogen and/or argon atmosphere. This process is carried out in a suitable oven.

Preferably, it is conducted at a temperature in the order of 1200° C., for a time of less than three minutes.

As can be seen in FIG. 5B, the effect of this RTA treatment is to cause the overlapping and encapsulation of a peripheral edge 30 of the buried oxide layer 3, by a lateral layer called an "encapsulation" layer and referenced 40.

It will also be noted that this encapsulation treatment can also be carried out by long annealing, for example, annealing at between 1000° C. and 1250° C., for a time of between 5 minutes and a few hours, instead of using RTA.

This encapsulated substrate 1 forms the initial SOI substrate to which the thinning method of the invention is applied.

As shown in FIG. 5C, this thinning method comprises a first thermal oxidation step, conducted in a horizontal oven (equipment marketed by TEL), over temperature ranges of between 800° C. and 1150° C.

This thermal oxidation is conducted under conditions permitting full oxidation of the lateral encapsulation layer 40, i.e., oxidation extending over its entire depth as far as the peripheral edge 30 of the buried oxide layer 3.

The oxidized encapsulation layer carries reference number 40'.

Also, this oxidization treatment additionally has the effect of oxidizing the upper part of the silicon surface layer 4. This oxidized part carries reference 41.

By continuing oxidization of the encapsulation layer 40' as far as the buried oxide layer 3, it is possible during subsequent steps to completely remove and expose the peripheral edge 30 of layer 3.

Figure 5D:
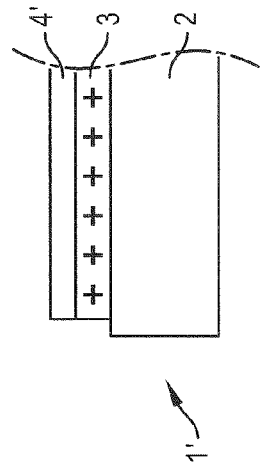

As illustrated in FIG. 5D, a first chemical etch step is then carried out performed firstly to remove the thermal oxide 41 and thereby thin the silicon surface layer 4, and secondly to completely lift away all the unstable parts of the edge of the substrate, i.e., the oxidized encapsulation layer 40'. The thinned surface layer 4 carries reference 4'. The thinned SOI substrate carries reference 1'.

It is noted that oxidation of the silicon surface layer 4 is only conducted over a certain thickness (layer 41), so that after the removal of this layer 41, the thinned layer 4' has the thickness it is desired to obtain. Persons skilled in the art can therefore adapt oxidation parameters taking into account the initial thickness of layer 4 and the desired thickness of the thinned layer 4'.

In one particular application of the invention, a SOI substrate is obtained whose thinned active silicon layer 4' has a thickness of 50 nm or less (extra-thin layer 4'), even of 30 nm or less.

The etch step is preferably conducted using a hydrofluoric acid HF bath. However, it could also be carried out using another strong acid such as sulphuric acid, for example.

Preferably, hydrofluoric acid HF solution is used at a concentration of 10% by volume in water to 50% by volume in water, preferably at a concentration of 10% by volume in water. This solution is applied at a temperature of between 20° C. and 30° C., preferably in the region of 25° C. This treatment is conducted for a time of between 30 seconds and 500 seconds, preferably between 100 seconds and 500 seconds, further preferably for 100 seconds.

Typically a hydrofluoric acid solution HF is used at a concentration of 10% by volume in water, applied for between 100 and 500 seconds at between 20° C. and 30° C. to remove 100 nm of oxide.

The time spent in the HF bath is evidently proportional to the thickness of the oxide generated by the thermal oxidation treatment. This time is slightly increased, however, to ensure full removal of the oxide according to the invention.

This first etch bath is followed by a first cleaning step using treatment known under the name RCA. This first treatment consists of successively immersing the SOI substrate in:
- a first bath of water, preferably deionized water;
- a second bath in a solution known as "SC1" (Standard Clean 1), which contains a mixture of ammonium hydroxide ($NH_4OH$), hydrogen peroxide ($H_2O_2$) and deionized water; and
- a third bath in a solution known as "SC2" (Standard Clean 2), which contains a mixture of hydrochloric acid (HCl), hydrogen peroxide ($H_2O_2$) and deionized water.

Preferably the SC1 bath is applied at a temperature of 70° C. for a time of 3 minutes, whereas the SC2 bath is applied at a temperature of 30° C. for a time of 3 minutes.

After this cleaning step, it is observed that numerous particles consisting both of silicon and silicon oxide particles have been deposited on the surface of the thinned layer 4'. These particles carry reference 5 in FIG. 5E.

Figure 1:
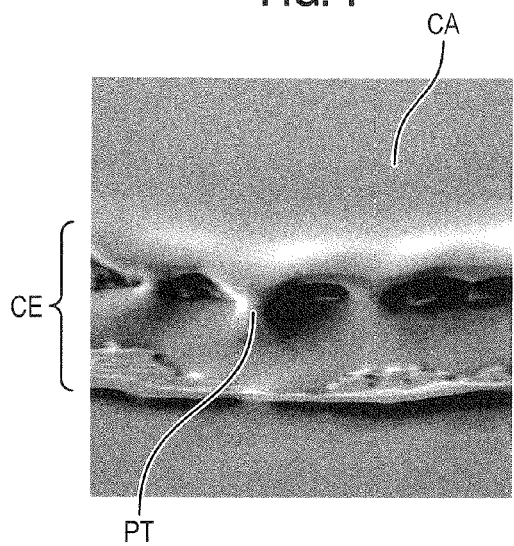
Figure 1A:
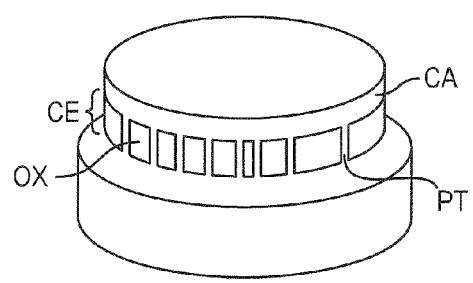
Figure 2:
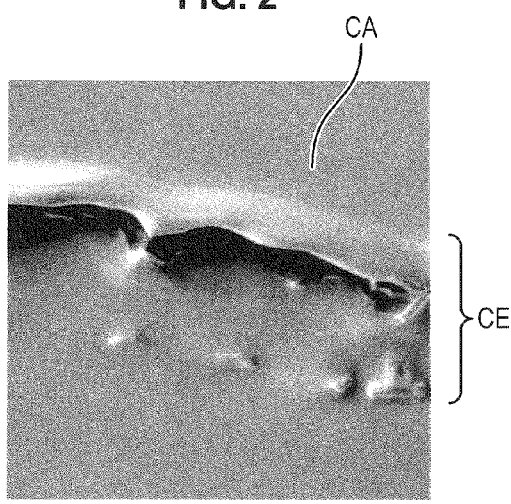
Figure 3:
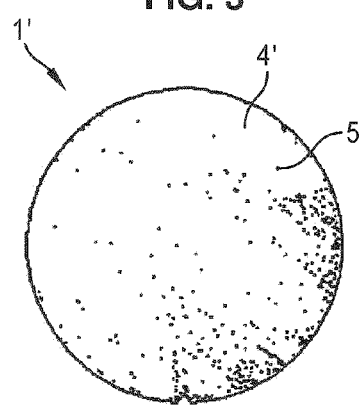
FIGS. 3 and 4 derive from observations made under scanning electron microscopy of the surface of the silicon surface layer of a thinned SOI substrate, respectively, at an intermediate stage of the method conforming to the invention and at the final stage.

An example of the surface of the top layer 4' of a SOI substrate obtained at this stage in the method of the invention is illustrated in FIG. 3. The substrate 1' emerges from this step in a relatively soiled state, even very soiled since the demolished bridges of the lateral encapsulation layer 40 are deposited in the form of particles or debris.

Next a second etch step is performed, also preferably with hydrofluoric acid HF solution under the conditions described above.

The effect of this second etch step is to lift away the debris 5 that has accumulated on the surface of the thinned SOI substrate 1'.

The first cleaning step and second etch step are successive steps, i.e., they follow after each other.

Finally RCA cleaning is carried out such as described previously, to obtain the final substrate 1' illustrated in FIG. 5F, in which the silicon surface layer 4' is thinned and will subsequently form the layer on which components are to be fabricated.

Figure 4:
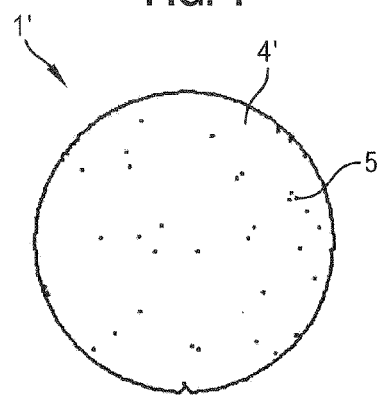

An example of the result obtained after this cleaning step is illustrated in FIG. 4, in which it can be ascertained that a large quantity of polluting debris has disappeared.

According to a second variant of embodiment of the invention, the initial substrate 1 has not undergone any encapsulation step. The oxidation treatment is therefore conducted solely so as to form the oxide layer 41. The subsequent steps are identical to those described for the first embodiment.

With the method conforming to the invention, it is therefore possible, if RTA treatment has been used, to maintain the beneficial smoothing effects of this treatment. Additionally, by means of the first extended etch step it is possible to break all the bridges or weakened regions of the encapsulation layer, which is most easy since the silicon oxide layer is very thin, so that subsequently the second etch step does not have any bridge to demolish and therefore does not generate any more polluting particles or debris but allows these particles to be lifted off the surface of the thinned substrate.

This latter advantage also exists even if the initial SOI substrate has not been subjected to any previous encapsulation.

What is claimed is:

1. A method to thin an initial silicon-on-insulator (SOI) substrate that includes a silicon oxide layer buried between a silicon carrier substrate and a silicon surface layer, the method comprising:
   conducting a thermal oxidation treatment of the initial SOI substrate to cause oxidation of part of the silicon surface layer and form a thermal oxide thereon;
   conducting a first cycle that comprises etching followed directly by cleaning of the silicon surface layer after the thermal oxidation treatment, wherein the etching of the first cycle comprises fully removing the thermal oxide from the silicon surface layer to thin the silicon surface layer and lift off all unstable parts of the initial substrate at edges thereof to form a thinned substrate; and
   conducting a second cycle, directly after the cleaning of the first cycle, the second cycle comprising etching followed directly by cleaning of the silicon surface layer, wherein the etching of the second cycle comprises removing from the surface of the thinned substrate, polluting particles formed during the first etching cycle and which have deposited thereupon, in order to obtain a final SOI substrate having a thinned surface layer which forms an active layer of the SOI substrate,
   wherein each of the cleaning of the first cycle and the cleaning of the second cycle comprises immersing the SOI substrate in water, then in a first solution comprising ammonium hydroxide, hydrogen peroxide and deionized water, and then in a second solution comprising hydrochloric acid, hydrogen peroxide and deionized water.

2. The thinning method according to claim 1, wherein the initial SOI substrate, before the thermal oxidation treatment, has undergone overlapping and encapsulation treatment of the peripheral edge of the buried silicon oxide layer, with an encapsulation layer derived from the surface layer, and wherein the oxidation treatment of the initial substrate is conducted so as to cause oxidation of the lateral encapsulation layer over its entire depth to as far as the buried silicon oxide layer.

3. The thinning method according to claim 2, wherein the overlapping and encapsulation treatment is conducted by a rapid thermal annealing.

4. The thinning method according to claim 1, wherein the thermal oxidation treatment is conducted at a temperature of between 800° C. and 1150° C.

5. The thinning method according to claim 1, wherein the oxidation and etching steps are conducted so as to obtain a final SOI substrate having an active silicon layer that has a thickness of 50 nm or less.

6. The thinning method according to claim 1, wherein the oxidation and etching steps are conducted so as to obtain a final SOI substrate having an active silicon layer that has a thickness of 30 nm or less.

7. The thinning method according to claim 1, wherein the initial SOI substrate comprises a silicon surface layer having a thickness of 400 nm or less.

8. The thinning method according to claim 1, wherein the etching of the first or second cycles is performed using a hydrofluoric acid HF water solution having a concentration of between 10% and 50% by volume, at a temperature of between 20° C. and 30° C. for a time of between 30 seconds and 500 seconds.

9. The thinning method according to claim 8, wherein the etching of the first cycle is performed using a hydrofluoric acid HF water solution having a concentration of 10% by volume, which is applied at a temperature of between 20° C. and 30° C. for a time of between 100 s and 500 s, to remove 100 nm of silicon oxide.

10. The thinning method according to claim 1, wherein each of the cleaning of the first cycle and the cleaning of the second cycle comprises immersing the SOI substrate in water, then, directly thereafter, immersing the SOI substrate in a first solution comprising ammonium hydroxide, hydrogen peroxide and deionized water, and then, directly thereafter, immersing the SOI substrate in a second solution comprising hydrochloric acid, hydrogen peroxide and deionized water.

11. A method to thin an initial silicon-on-insulator (SOI) substrate that includes a silicon oxide layer buried between a silicon carrier substrate and a silicon surface layer, the method comprising: conducting a thermal oxidation treatment of the initial SOI substrate at a temperature of between 800° C. and 1150° C. to cause oxidation of the thickness of the silicon surface layer and form a thermal oxide thereon;
   conducting a first cycle that comprises etching followed directly by cleaning of the silicon surface layer after the thermal oxidation treatment, wherein the etching of the first cycle comprises fully removing the thermal oxide from the silicon surface layer to thin the silicon surface layer and lift off all unstable parts of the initial substrate at edges thereof to form a thinned substrate;
   conducting a second cycle, directly after the cleaning of the first cycle, the second cycle comprising etching followed directly by cleaning of the silicon surface layer, wherein the etching of the second cycle comprises removing from the surface of the thinned substrate, polluting particles formed during the first etching cycle and which have deposited thereupon, in order to obtain a final SOI substrate having a thinned surface layer which forms an active layer of the SOI substrate, wherein the active silicon layer has a thickness of 50 nm or less,
   wherein the etching of the first or second cycles is performed using a hydrofluoric acid HF water solution having a concentration of between 10% and 50% by volume, at a temperature of between 20° C. and 30° C. for a time of between 30 seconds and 500 seconds, and
   wherein the cleaning of the first or second cycles is performed by immersing the SOI substrate in water, then in a first bath of solution containing a mixture of ammonium hydroxide, hydrogen peroxide and deionized water, then in a second bath of a solution containing a mixture of hydrochloric acid, hydrogen peroxide and deionized water.

12. The thinning method according to claim 11, wherein the initial SOI substrate, before the thermal oxidation treatment, has undergone overlapping and encapsulation treatment of the peripheral edge of the buried silicon oxide layer, with an encapsulation layer derived from the surface layer, and wherein the oxidation treatment of the initial substrate is conducted so as to cause oxidation of the lateral encapsulation layer over its entire depth to as far as the buried silicon oxide layer.

13. The thinning method according to claim 12, wherein the overlapping and encapsulation treatment is conducted by a rapid thermal annealing.

14. The thinning method according to claim 11, wherein the cleaning of the first or second cycles is performed by immersing the substrate in water, then, directly thereafter, in a first bath of solution containing a mixture of ammonium hydroxide, hydrogen peroxide and deionized water, then, directly thereafter, in a second bath of a solution containing a mixture of hydrochloric acid, hydrogen peroxide and deionized water.

* * * * *